United States Patent [19]
Davis et al.

[11] Patent Number: 5,420,545
[45] Date of Patent: May 30, 1995

[54] PHASE LOCK LOOP WITH SELECTABLE FREQUENCY SWITCHING TIME

[75] Inventors: Craig M. Davis; David A. Byrd, both of Puyallup, Wash.

[73] Assignee: National Semiconductor Corporation, Santa Clara, Calif.

[21] Appl. No.: 213,935

[22] Filed: Mar. 16, 1994

Related U.S. Application Data

[63] Continuation-in-part of Ser. No. 29,079, Mar. 10, 1993, abandoned.

[51] Int. Cl.$^6$ .................. H03L 7/107; H03L 7/18
[52] U.S. Cl. .................................. 331/17; 331/16; 331/18; 331/25; 455/260
[58] Field of Search ............... 331/1 A, 10, 11, 12, 331/15, 16, 17, 18, 25, DIG. 2; 375/120; 455/260

[56] References Cited

U.S. PATENT DOCUMENTS

| | | | |
|---|---|---|---|
| 4,330,758 | 5/1982 | Swisher et al. | 332/1 A |
| 4,714,899 | 12/1987 | Kurtzman et al. | 331/16 X |
| 4,745,372 | 5/1988 | Miwa | 331/8 |
| 4,893,094 | 1/1990 | Herold et al. | 331/1 A |
| 4,980,653 | 12/1990 | Shepherd | 331/16 |
| 5,113,152 | 5/1992 | Norimatsu | 331/11 |
| 5,128,632 | 7/1992 | Erhart et al. | 331/16 X |
| 5,146,187 | 9/1992 | Vandegraaf | 331/16 X |
| 5,276,408 | 1/1994 | Norimatsu | 331/16 X |
| 5,307,071 | 4/1994 | Arnold et al. | 331/1 A X |
| 5,339,050 | 8/1994 | Llewellyn | 331/16 |

OTHER PUBLICATIONS

Eitan Sharoni, "Digital Control Speeds Synthesizer Switching", *Microwaves & RF*, Apr. 1987, pp. 107, 108, 110 and 112.

*Primary Examiner*—David Mis
*Attorney, Agent, or Firm*—Limbach & Limbach; H. Donald Nelson; Richard J. Roddy

[57] ABSTRACT

A phase lock loop (PLL) circuit for controlling an oscillator includes a phase comparator, a loop filter, a reference converter and a feedback converter whose performance characteristics are dynamically controlled so as to provide a phase-locked output signal with both high frequency stepping resolution and low phase locking time. The phase comparator compares the relative phases of the reference and feedback signals, and outputs a phase difference signal representing such phase comparison. The loop filter, in accordance with a filter bandwidth dynamically selected by a filter control signal, filters the phase difference signal to provide a frequency control signal for a voltage controlled oscillator (VCO). The reference converter is a programmable frequency divider which, in accordance with a reference proportionality factor dynamically selected by a reference control signal, reduces the frequency of the PLL reference signal frequency used by the phase comparator. The feedback converter is another programmable frequency divider which, in accordance with a feedback proportionality factor dynamically determined by a feedback control signal, reduces the frequency of the VCO feedback signal frequency used by the phase comparator. Each combination of a selected filter bandwidth, a reference proportionality factor and a feedback proportionality factor corresponds to a different time interval within which phase lock is achieved.

63 Claims, 5 Drawing Sheets

PHASE LOCK LOOP WITH SELECTABLE FREQUENCY SWITCHING TIME

RELATED APPLICATIONS

This is a Continuation-In-Part of U.S. application Ser. No. 08/029,079, filed Mar. 10, 1993, now abandoned and entitled "Phase Locked Loop Having Reduced Time to Produce Output Signal" (as amended).

BACKGROUND OF THE INVENTION

1. Field of the Invention

The present invention relates to phase lock loops having programmable output frequencies, and in particular, to phase lock loops having programmable output frequencies with selectable frequency switching speeds.

2. Description of the Related Art

Phase lock loops (PLLs) have long been a fundamental element in modern communications systems, particularly those requiring frequency agility such as frequency hopping. The frequency switching, or phase locking, time of a conventional PLL is limited by the period (inverse of frequency) of the reference signal applied to one input of the phase detector. The frequency of the reference signal determines how often the PLL makes corrections to the frequency of its output signal which is fed back and compared at the reference frequency rate. Thus, if a faster frequency switching, or phase locking, time is desired, the reference frequency can be increased. Running the PLL at progressively higher reference frequencies enables the system to lock in proportionately less time.

However, the reference frequency also sets the resolution, or frequency stepping capability, of the PLL which, in turn, has an upper limit established by system level constraints, such as channel spacing or channel fine tuning. Accordingly, increasing the reference frequency beyond this limit would result in either skipping channels or fine tuning more coarsely than desired. Furthermore, increasing the reference frequency of the PLL requires an increase in the cut-off frequency of the low pass (typically) loop filter. However, this requirement of a wide loop filter bandwidth for achieving fast frequency switching times is contrary to the requirement of a narrow loop filter bandwidth for meeting the requirements for high resolution or frequency stepping capability.

Conventional PLL designs have sought to achieve both fast frequency switching times and high frequency resolution in a number of ways. For example, see E. Sharoni, "Digital Control Speeds Synthesizer Switching", Microwaves & RF, April 1987, pages 107–12, the disclosure of which is incorporated herein by reference. However, notwithstanding such improvements in conventional design techniques, further improvements would be desirable.

SUMMARY OF THE INVENTION

A PLL circuit in accordance with a preferred embodiment of the present invention controls an oscillator to provide an output signal which is phase-locked to a reference signal with high frequency stepping resolution and low phase locking time, and includes a phase comparator, loop filter, reference converter and feedback converter.

The phase comparator receives and compares the phases of a frequency-converted (e.g. divided) reference signal and a frequency-converted feedback signal, and in accordance therewith provides a phase difference signal representing the difference between the frequency-converted reference and feedback signal phases.

The loop filter, coupled to the phase comparator, receives the phase difference signal and also receives a filter control signal in accordance with which a filter bandwidth is selected to filter the phase difference signal to provide a frequency control signal for controlling the output frequency of an oscillator (e.g. a voltage-controlled oscillator).

The reference converter, also coupled to the phase comparator, receives a reference source signal at a reference source signal frequency and also receives a reference control signal in accordance with which it frequency-converts (e.g. frequency-divides) the reference source signal to provide the frequency converted reference signal. This frequency converted reference signal has a frequency which is proportional to the reference source signal frequency in accordance with one of a number of reference proportionality factors which are selected in accordance with the reference control signal.

The feedback converter, also coupled to the phase comparator, receives the oscillator output signal (at the oscillator output signal frequency) and also receives a feedback control signal in accordance with which it frequency-converts the oscillator output signal to provide the frequency-converted feedback signal. This frequency-converted feedback signal has a frequency which is proportional to the oscillator output signal frequency in accordance with one of a number of feedback proportionality factors which are selected in accordance with the feedback control signal.

The above-described selected filter bandwidths, reference proportionality factors and feedback proportionality factors correspond to one of a number of time intervals.

Further in accordance with a preferred embodiment of the present invention, the phase comparator receives a comparator control signal and in accordance therewith compares the phases of the frequency-converted reference and feedback signals to provide the phase difference signal. The comparator control signal is used to select one of a number of comparator gain factors, and the selected comparator gain factor corresponds to the above-noted one of a number of time intervals.

In accordance with the present invention, the phase lock time of a digital PLL can be substantially reduced (e.g. by a factor of two, four, etc.) while maintaining a desired frequency resolution.

DETAILED DESCRIPTION OF THE INVENTION

Figure 1:
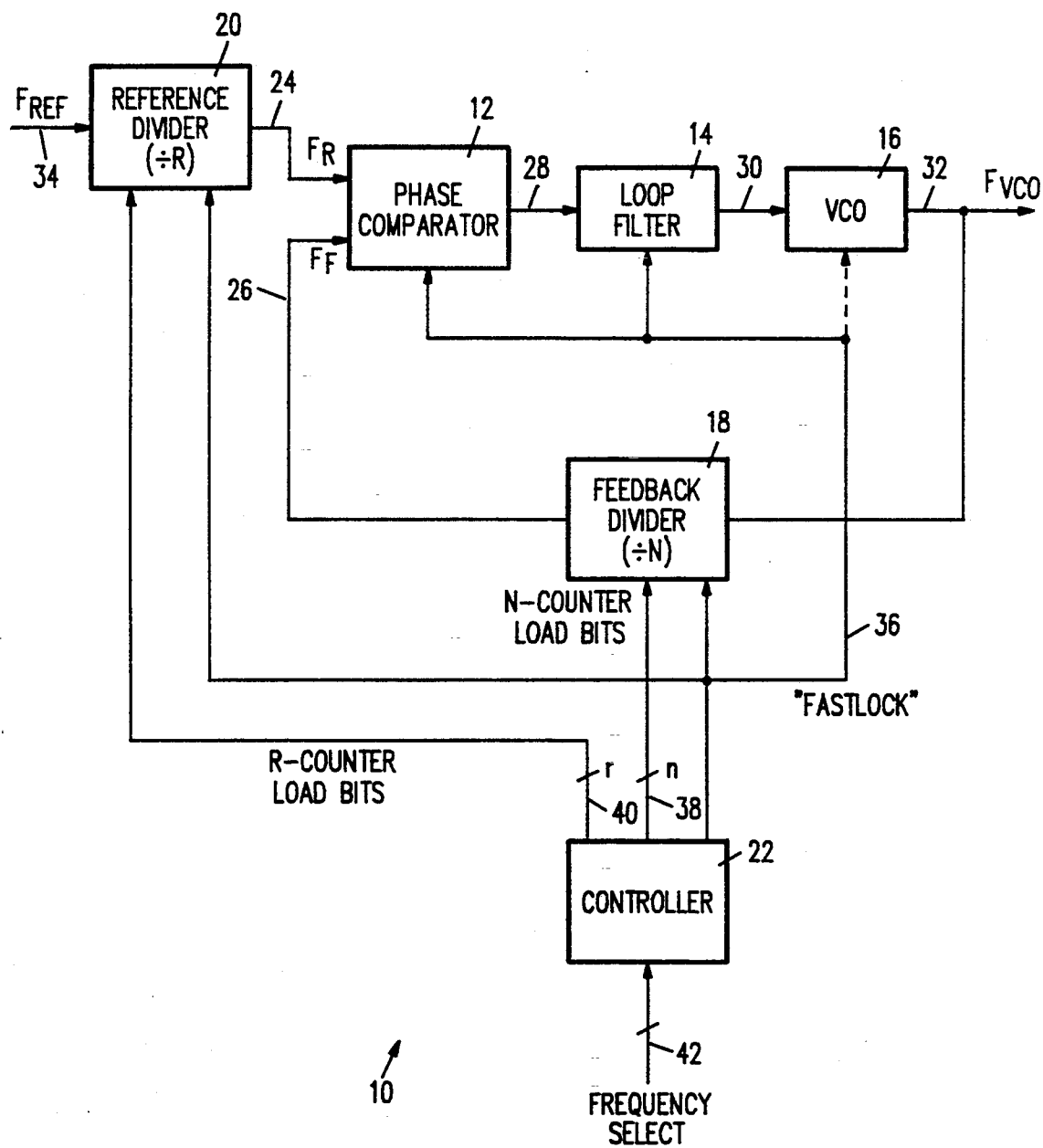
FIG. 1 is a functional block diagram of a PLL in accordance with a preferred embodiment of the present invention.

Referring to FIG. 1, a PLL 10 in accordance with a preferred embodiment of the present invention includes a phase comparator (e.g. detector) 12, loop filter 14, voltage-controlled oscillator (VCO) 16, a feedback frequency divider 18, a reference frequency divider 20 and a controller 22, all connected substantially as shown.

The phase comparator 12 receives and compares the relative phases of a reference signal 24 and a feedback signal 26 (both discussed further below). The phase comparator 12 provides an output signal 28 representing the phase difference between these input signals 24, 26. This output signal 28 is filtered by the loop filter 14, which is typically a low pass filter. The filtered signal 30 is used as the control signal for the VCO 16, i.e. to set and maintain (e.g. correct) the frequency of the output signal 32 from the VCO. The VCO output signal 32 is fed back to the feedback divider 18 where it is divided down in frequency (discuss further below) to generate the aforementioned feedback signal 26. The reference signal 24 is a frequency-divided version of a reference oscillator signal 34 (e.g. from a crystal-controlled oscillator). (Alternatively, the reference signal 24 can be a frequency-multiplied version of the reference oscillator signal 34 with the reference frequency divider 20 being replaced by a frequency multiplier having selectable multiplication factors, or multipliers.)

Both the feedback divider 18 and reference divider 20 are controlled by a "fastlock" signal 36 from the controller 22. While the fastlock signal 36 is in its non-asserted, or inactive state, the PLL functions in a conventional manner. In accordance with feedback divider programming, or load, bits 38 and reference divider programming, or load, bits 40, the VCO output signal 32 and reference oscillator signal 34 are divided down in frequency so as to set and maintain the VCO output signal 32 at its desired frequency. As discussed further below, when the fastlock signal 36 is asserted, or active, it causes the feedback and reference dividers 18, 20 to temporarily modify their respective programming bits 38, 40 to enable the PLL 10 to lock onto a new frequency faster than normal, such as twice or four times as fast.

Assertion of the fastlock signal 36 is controlled by the controller 22. Upon receiving a new frequency select command signal 42, the controller 22 provides the appropriate corresponding feedback and reference divider programming bits 38, 40 and asserts the fastlock signal 36 to enable the fastlock feature of the PLL 10. (The following discussion of the operation and advantages of the PLL 10, in accordance with a preferred embodiment of the present invention, is in the context of a twice-normal phase locking speed. However, it should be understood that, in accordance with the present invention, even faster phase locking rates can be achieved in accordance with the principles of the present invention described herein.)

In the case of a twice-normal phase locking rate, the divisors, or moduli, for the feedback 18 and reference 20 dividers are temporarily halved, i.e. reduced by a factor of two, and the cut-off frequency of the low pass loop filter 14 is increased by a factor of two. Doing this in a coordinated fashion, i.e. in synchronism with the assertion and de-assertion of the fastlock signal 36, the overall loop stability criteria, namely the damping factor and phase margin, can be preserved while cutting the phase lock response time in half.

The first objective of reducing the divisors for the feedback 18 and reference 20 dividers by a factor of two is relative trivial. First, the frequency of the reference oscillator signal 34 can generally be freely chosen to ensure that the divisor for the reference divider 20 is such that its "quotient" can always be an integer after the aforementioned reduction by a factor of two. However, such freedom to avoid a non-integer divisor does not apply with respect to the feedback divider 18. Nonetheless, as discussed further below, appropriate divider circuits can be constructed to address both of these conditions.

The second objective of increasing the cut-off frequency of the low pass loop filter 14 by a factor of two, must be accomplished without impacting the loop damping factor or phase margin. The loop dynamics and settling time of the PLL 10 are optimized by setting the loop filter components based upon the feedback divide ratio, the gain Kp of the phase detector 12 and the gain Kv of the VCO 16.

Figure 2:
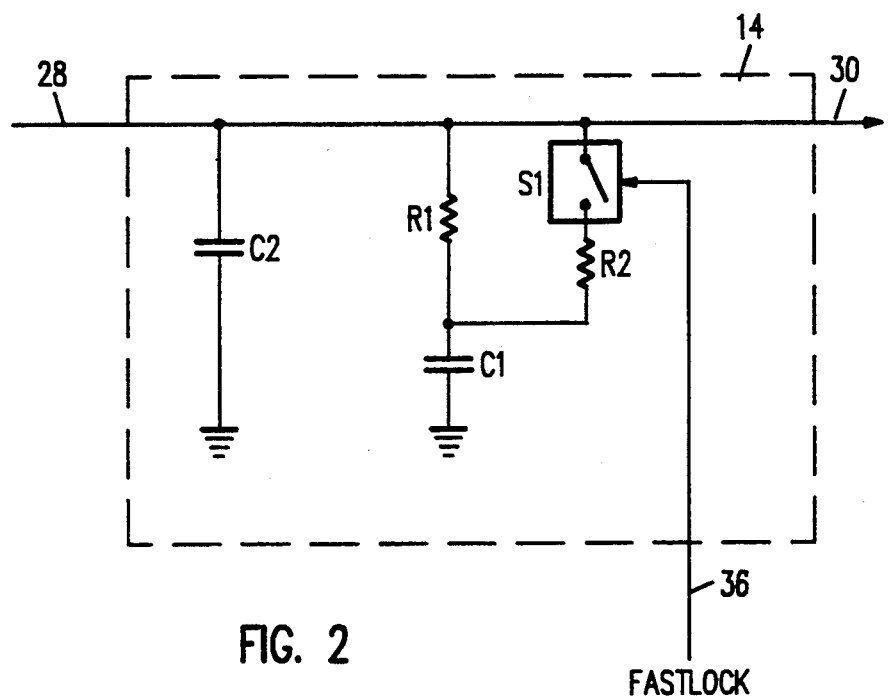
FIG. 2 is a schematic diagram of an exemplary loop filter for the PLL of FIG. 1.

Referring to FIG. 2, an exemplary design for the low pass loop filter 14 is illustrated. A serial combination of resistor R1 and capacitor C1 form a shunt impedance which is in parallel with shunt capacitor C2, as shown. Connected in parallel with resistor R1 is a serial combination of resistor R2 and switch S1. Switch S1 is opened or closed in accordance with non-assertion or assertion of the fastlock signal 36, respectively. (It should be understood that switch S1 is referred to as a "switch" merely to describe its function within the filter 14. This function can be provided in any number of well known ways, such as by a transmission gate.)

As noted above, to maintain loop dynamics of the PLL 10, the individual gain blocks in the loop need to be coordinated so that their net gain and phase at the new cut-off frequency remains unchanged. For example, if the gain of the feedback divider 18 is reduced by a factor of two and the gain of the loop filter 14 at any given frequency is increased by a factor of two, then the gain of either the VCO 16 (Kv) or phase comparator 12 (Kp) must be altered (e.g. multiplied or divided) proportionally to hold the net product constant.

According to well known principles, the open loop gain G(s) for the PLL 10 can be expressed as follows:

$$G(s) = \frac{Kp \, Kv \, Z(s)}{N s} \qquad \text{Eq. (1)}$$

where:
G(s)=open loop gain function
s=Laplace transform variable
Kp=phase detector gain factor (volts/radian)
Kv=VCO gain factor (Hz/volt)
Z(s)=loop filter transfer function
N=feedback divisor Further, it can be shown that the transfer function of the loop filter 14, as shown in FIG. 2, can be expressed as follows:

$$Z(s) = \frac{1}{sC2} // \frac{1}{sC1} + R1 \qquad \text{Eq. (2)}$$

$$= \frac{1}{sC1} \cdot \frac{sR1\,C1 + 1}{sR1\,C2 + 1 + C2/C1}$$

$$\approx \frac{1}{sC1} \cdot \frac{sR1\,C1 + 1}{sR1\,C2 + 1}$$

where:

R1=resistance value of resistor (ohms)
C1=capacitance value of serial capacitor (farads)
C2=capacitance value of shunt capacitor (farads)
C2<<C1

Substituting the above expression for the loop filter function Z(s) into the expression for the open loop gain function G(s) produces the following:

$$G(s) = \frac{Kp\,Kv}{s^2\,N\,C1} \cdot \frac{sR1\,C1 + 1}{sR1\,C2 + 1} \qquad \text{Eq. (3)}$$

Figure 3:
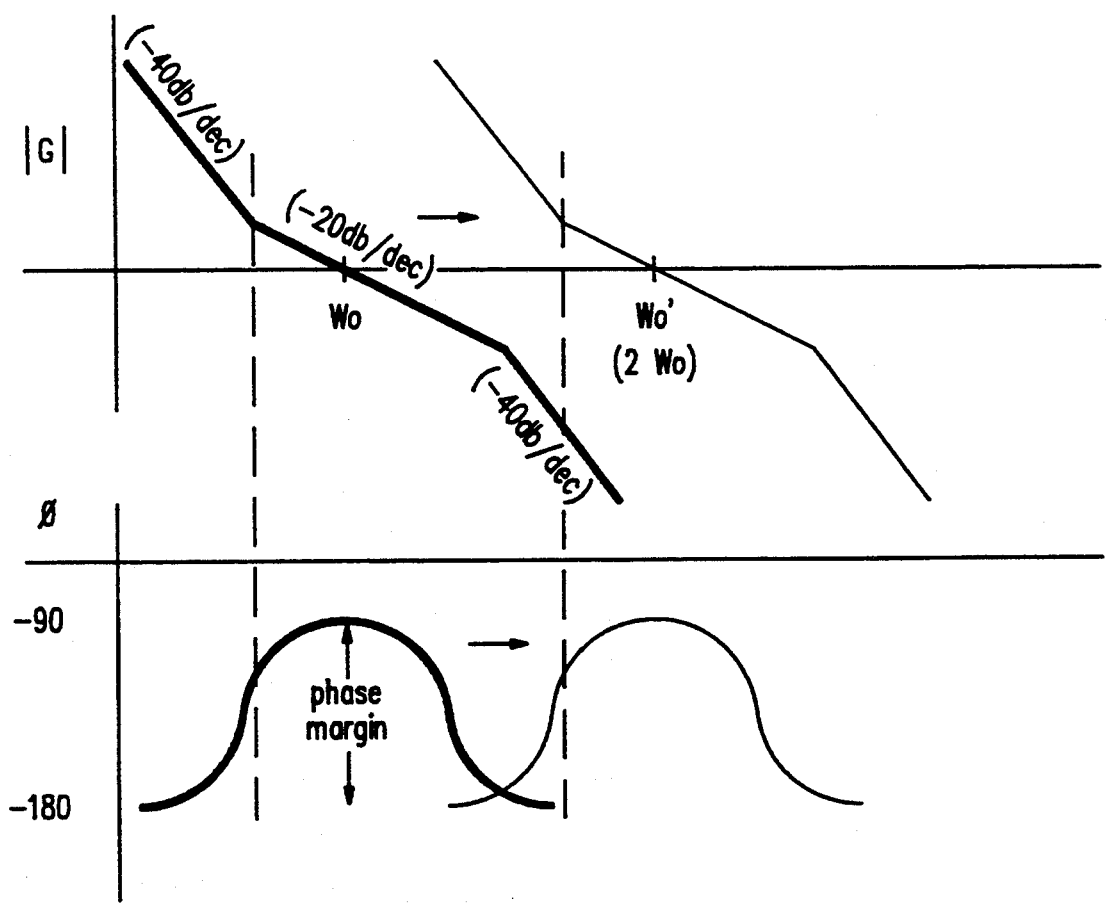
FIG. 3 illustrates the shift in open loop gain and phase versus frequency functions achieved with a PLL in accordance with a preferred embodiment of the present invention.

Referring to FIG. 3, the general characteristics for the gain and phase responses versus frequency for the PLL 10 are as shown. In accordance with the present invention, these curves are shifted over in frequency to correspond to an increase by a factor of two of the loop bandwidth without changing the slopes of the gain and phase (versus frequency) relationships. As seen in FIG. 3, the shifted curves show the zero axis crossing occurring with the same phase margin as in the previous set of curves. (It should be noted that it is also desirable to maintain the relationship between $W_0$ and the reference frequency rate of the loop, i.e. by also doubling the frequency of the loop reference signal 24.)

Doubling the zero corner frequency $W_0$ (e.g. where $s'=2s=2/R1C1$) indicates that either R1 or C1 must be reduced by a factor of two during fastlock. By choosing the resistor R1 (FIG. 2), both the zero and high frequency pole of the filter transfer function (due to capacitor C2) are increased proportionally and the phase margin remains unchanged. Further, switching the resistor instead of a capacitor avoids dealing with considerations about initial charging (or discharging) of capacitors when the component is switched in (or out).

With the divisor for the feedback divider 18 and the effective resistance of the parallel combination of resistors R1 and R2 reduced by a factor of two (thereby increasing the corner frequency $W_0$ by a factor of two), it can be shown that the resulting open loop gain function $G(2s_0)$ can be expressed as follows:

$$G(s_0) = \frac{Kp\,Kv}{2s_0^2\,N\,C1} \cdot \frac{s_0 R1\,C1 + 1}{s_0 R1\,C2 + 1} \qquad \text{Eq. (4)}$$

Comparing Equations (3) and (4) shows that the open loop gain becomes reduced by a factor of two. Accordingly, the gain Kp of the phase comparator 12 or the gain Kv of the VCO 16 must be doubled so as to maintain the original loop gain. Adjustment of the gain Kp for the phase comparator 12 is generally preferable in most instances since it is typically such an integral component of a PLL circuit (e.g. as part of an integrated circuit) and is generally readily adjustable. However, as shown in FIG. 1, the fastlock signal 36 can be used to selectively alter either the phase comparator gain Kp or VCO gain Kv. Indeed, if desired, a number of combinations or permutations of PLL circuit 10 characteristic adjustments can be implemented in accordance with the present invention. For example, when increasing the cutoff frequency by a factor X (Fc'=XFc), other PLL circuit 10 characteristics can be adjusted according to the following:

TABLE 1

| Feedback Divisor | Phase Comparator Gain | VCO Gain |
|---|---|---|
| N' = N/X$^2$ | Kp' = Kp | Kv' = Kv |
| N' = N | Kp' = X$^2$ Kp | Kv' = Kv |
| N' = N | Kp' = Kp | Kv' = X$^2$ Kv |
| N' = N/X | Kp' = X Kp | Kv' = Kv |
| N' = N/X | Kp' = Kp | Kv' = X Kv |

The feedback divisor N and phase comparator gain Kp can often be more easily controlled since these functions would typically be integrated together within either one integrated circuit or a chip set. On the other hand, the phase comparator gain Kp and VCO gain Kv may provide more freedom for the circuit designer since these functions generally tend to be analog in nature.

Figure 4:
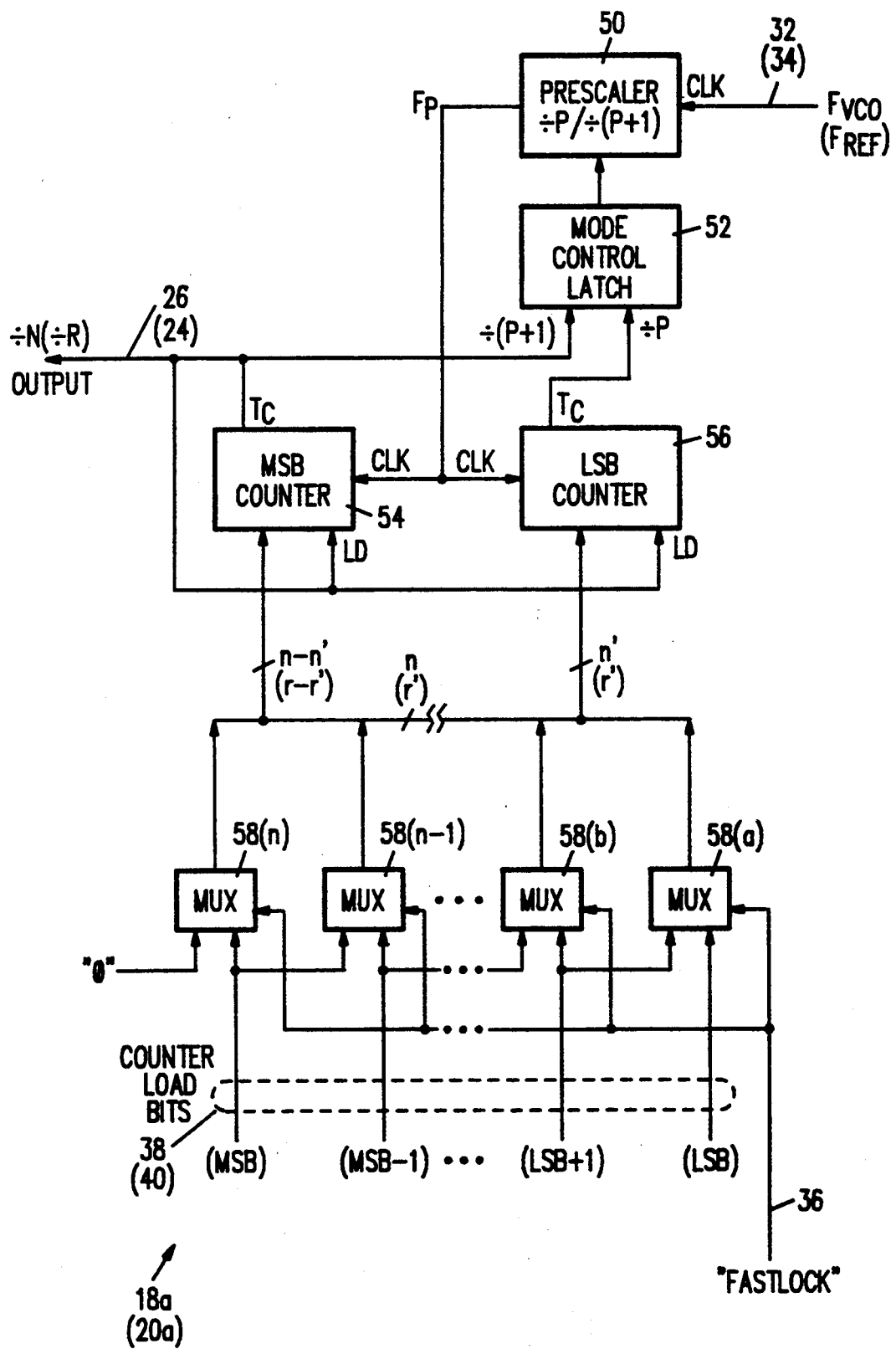
FIG. 4 is a functional block diagram of a programmable frequency divider which can be used for the feedback and reference dividers of FIG. 1.

Referring to FIG. 4, a frequency divider circuit 18a (20a) suitable for use as either the feedback divider 18 or reference divider 20 includes a prescaler 50, mode control latch 52, MSB counter 54, LSB counter 56 and multiple multiplexors 58(a)–58(n), all connected substantially as shown.

In a normal divide-by-N mode of operation, the fast-lock signal 36 is not asserted, and the counter programming bits pass directly through the multiplexors 58(a)–58(n) to the MSB and LSB counters 54, 56, with the most significant programming bit being loaded into the highest bit location of the MSB counter 54. The MSB and LSB counters 54, 56 are clocked simultaneously by the output Fp of the prescaler 50 until the LSB counter 56 counts down to zero, thereby causing the terminal count Tc of the LSB counter 56 to become asserted. This, via the mode control latch 52, sets the prescaler 50 to the divide-by-P, or "MOD(P)", mode. This mode is maintained until the prescaler 50 output Fp clocks the MSB counter 54 down to zero, thereby causing the terminal count Tc of the MSB counter 54 to become asserted. The assertion of the terminal count Tc from the MSB counter 54 causes the prescaler 50, via the mode control latch 52, to revert back to the divide-by-(P+1), or "MOD(P+1)", mode, as well as reloading of both the MSB and LSB counters 54, 56. (In accordance with well known principles, the correct mix of MOD(P) and MOD(P+1) cycles of the prescaler 50 results in the total division rate being equal to N (or R) as prescribed by conventional dual modulus operation.)

During fastlock operation, i.e. upon assertion of the fastlock signal 36, the multiplexors 58(a)–58(n) select the next higher order programming bits (e.g. a "shift right" operation per FIG. 4), thereby loading the MSB and LSB counters 54, 56 with data from the next higher order load bit positions. Accordingly, the divisor, or modulus, of the divider 18a (20a) is reduced by a factor of two.

Figure 5:
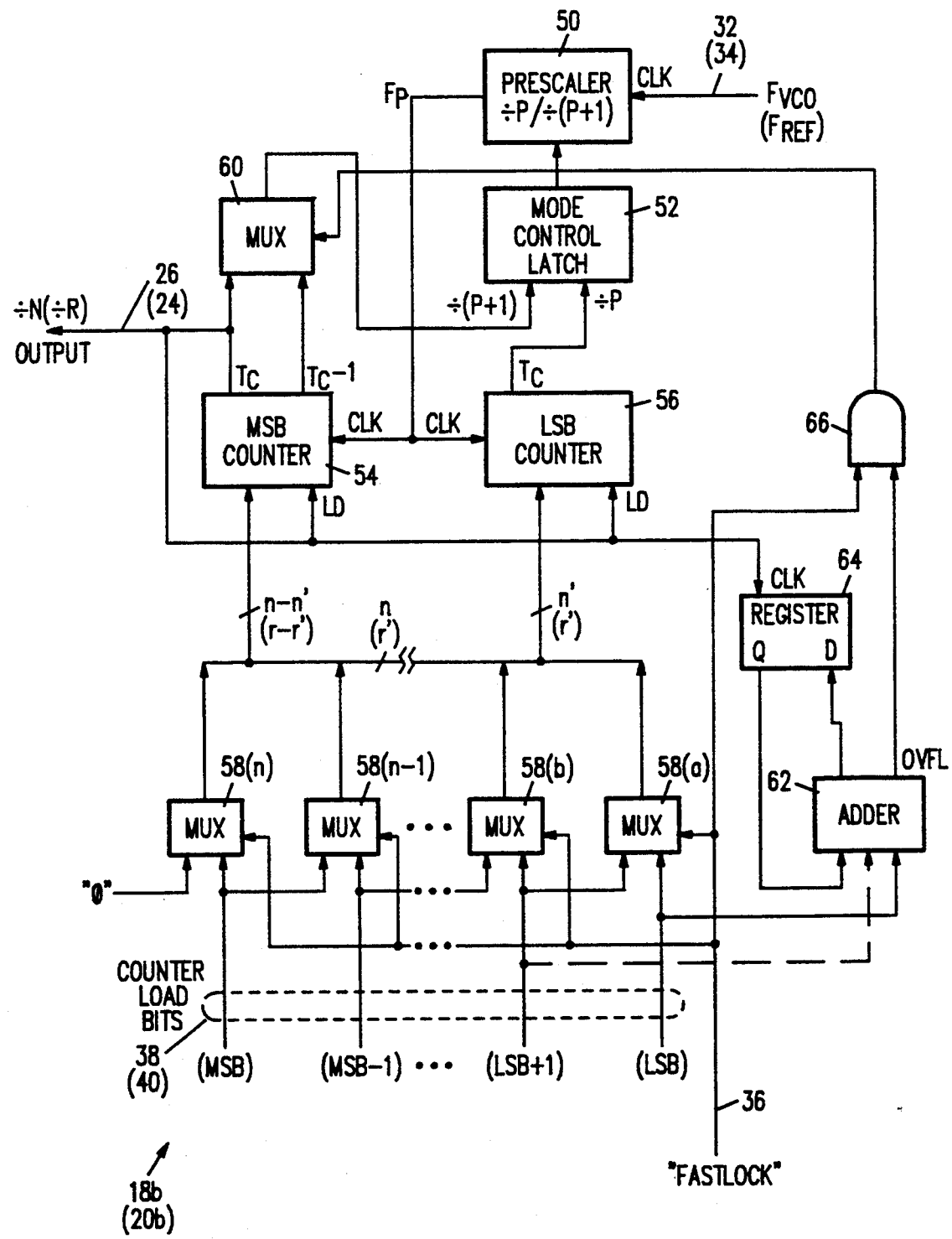
FIG. 5 is a functional block diagram of an alternative programmable frequency divider which can be used for the feedback and reference dividers of FIG. 1 when fractional—N (or —R) averaging is required.

Referring to FIG. 5, an alternative divider circuit 18b (20b) suitable for use as the feedback divider 18 (or reference divider 20) when non-integer, or fractional N (or R), division is needed includes the components listed above for the divider circuit 18a (20a) of FIG. 4, plus a MSB multiplexor 60, adder 62, D-type register 64 and logical AND gate 66, all connected substantially as shown. Its operation is generally similar to that of the divider circuit 18a (20a) of FIG. 4, as discussed above.

Figure 6:
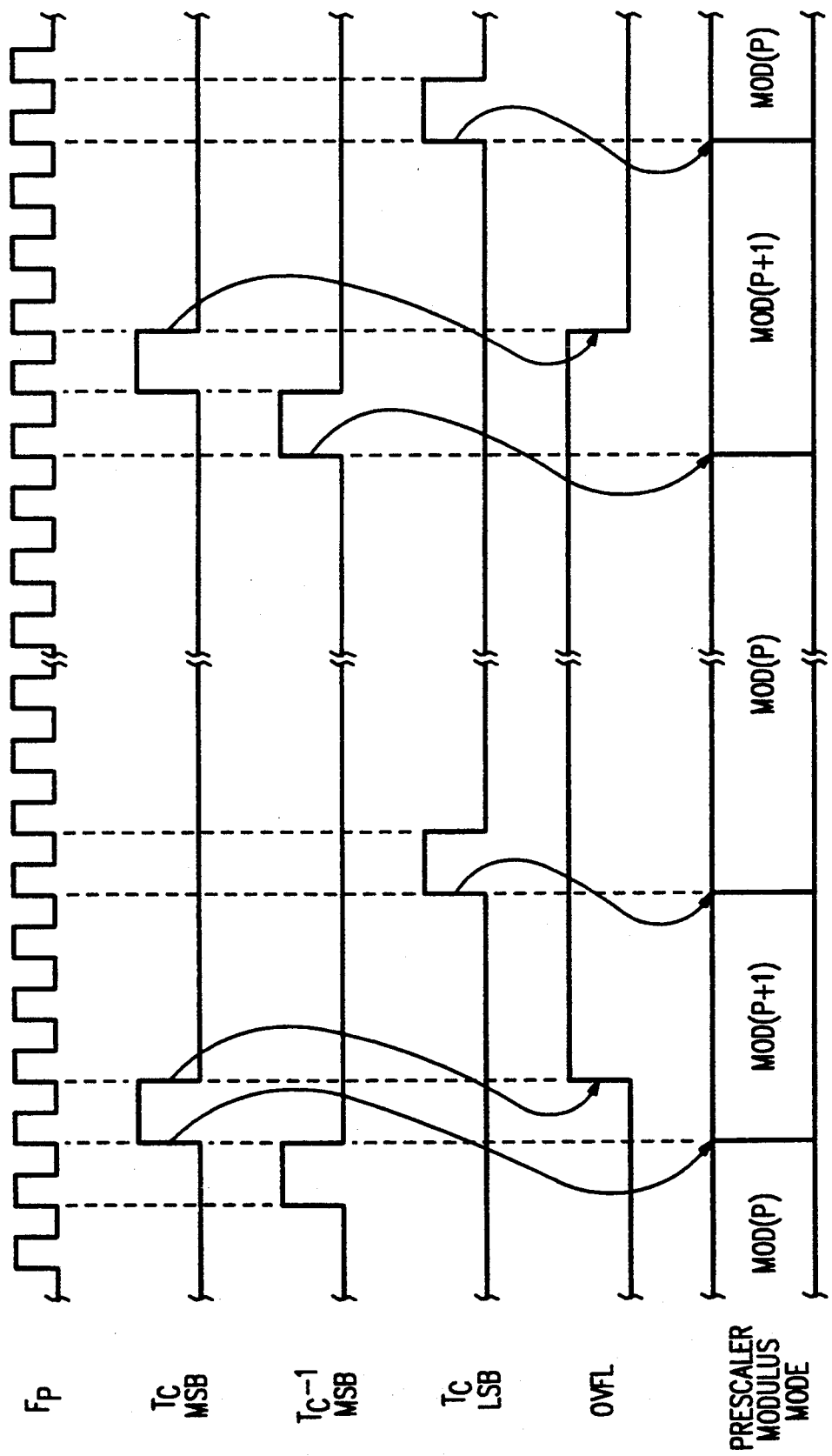
FIG. 6 is a timing diagram for the frequency divider of FIG. 5.

However, the least significant programming bit is added and re-added by the adder 62 every time the divider 18*b* (20*b*) completes a full cycle of division by N (now reduced by a factor of F). (If faster phase locking rates are needed [i.e. by reducing the divisor N by larger factors such as four, eight, etc.], then successively higher order bits [e.g. LSB+1, LSB+2, ... ] are also added by the adder 62, as indicated in FIG. 5.) Until the adder 62 overflows, the prescaler 50, via the mode control latch 52, remains set to the MOD(P+1) mode when the terminal count Tc of the MSB counter 54 is asserted. When the adder 62 does overflow, the next cycle of divide-by-N has one additional count in it by the prescaler 50 reverting to a MOD(P+1) mode one MSB count sooner (i.e. the MSB multiplexor 60 selects the next lower terminal count Tc-1 instead of the full terminal count Tc of the MSB counter 54 while the adder 62 overflow (OVFL) is asserted). Referring to FIG. 6, the timing relationships of these signals and/or functions can be better understood.

Various other modifications and alterations in the structure and method of operation of this invention will be apparent to those skilled in the art without departing with the scope and spirit of this invention. Although the invention has been described in connection with specific preferred embodiments, it should be understood that the invention as claimed should not be unduly limited to such specific embodiments.

What is claimed is:

1. A phase lock loop (PLL) circuit for controlling an oscillator to provide an output signal which is phase-locked to a reference signal with high frequency stepping resolution and low phase locking time, said PLL circuit comprising:

comparator means for receiving first and second comparator signals at first and second comparator signal frequencies and phases, respectively, and for comparing said first and second comparator signals and in accordance therewith providing a third comparator signal which represents a phase difference between said first and second comparator signal phases;

filter means, coupled to said comparator means, for receiving said third comparator signal, and for receiving a dynamic filter control signal having active and inactive states and in accordance therewith filtering said third comparator signal to provide a frequency control signal for controlling an oscillator to select a frequency of an output signal from said oscillator, wherein said filtering of said third comparator signal is in accordance with one of a plurality of filter bandwidths selected in accordance with said dynamic filter control signal;

reference converter means, coupled to said comparator means, for receiving a reference source signal at a reference source signal frequency, and for receiving a dynamic reference control signal having active and inactive states and in accordance therewith providing said first comparator signal, wherein said first comparator signal frequency is proportional to said reference source signal frequency in accordance with one of a plurality of reference proportionality factors selected in accordance with said dynamic reference control signal; and feedback converter means, coupled to said comparator means, for receiving said oscillator output signal at said oscillator output signal frequency, and for receiving a dynamic feedback control signal having active and inactive states and in accordance therewith providing said second comparator signal, wherein said second comparator signal frequency is proportional to said oscillator output signal frequency in accordance with one of a plurality of feedback proportionality factors selected in accordance with said dynamic feedback control signal;

wherein said selected ones of said pluralities of filter bandwidths, reference proportionality factors and feedback proportionality factors together correspond to one of a plurality of time intervals, and wherein said active states of said dynamic filter control signal, said dynamic reference control signal and said dynamic feedback control signal all coincide with one another.

2. A PLL circuit as recited in claim 1, wherein said comparator means comprises a phase detector.

3. A PLL circuit as recited in claim 1, wherein said filter means comprises a low pass filter.

4. A PLL circuit as recited in claim 1, wherein said reference converter means comprises a frequency divider and said plurality of reference proportionality factors comprises a plurality of reference divisors.

5. A PLL circuit as recited in claim 4, wherein said frequency divider comprises a programmable counter.

6. A PLL circuit as recited in claim 1, wherein said reference converter means comprises a frequency multiplier and said plurality of reference proportionality factors comprises a plurality of reference multipliers.

7. A PLL circuit as recited in claim 1, wherein said feedback converter means comprises a frequency divider and said plurality of feedback proportionality factors comprises a plurality of feedback divisors.

8. A PLL circuit as recited in claim 7, wherein said frequency divider comprises a programmable counter.

9. A PLL circuit as recited in claim 1, wherein said selected ones of said pluralities of filter bandwidths, reference proportionality factors and feedback proportionality factors together correspond to a PLL loop gain function, and wherein said PLL loop gain function remains substantially constant for selected combinations of ones of said pluralities of filter bandwidths, reference proportionality factors and feedback proportionality factors.

10. A PLL circuit as recited in claim 1, wherein said comparator means further receives a dynamic comparator control signal having active and inactive states and in accordance therewith compares said first and second comparator signals to provide said third comparator signal, and wherein said third comparator signal is provided in accordance with one of a plurality of comparator gain factors selected in accordance with said dynamic comparator control signal, and further wherein said selected one of said plurality of comparator gain factors corresponds to said one of said plurality of time intervals, and still further wherein said active state of said dynamic comparator control signal coincides with said active states of said dynamic filter control signal, said dynamic reference control signal and said dynamic feedback control signal.

11. A PLL circuit as recited in claim 10, wherein said selected ones of said pluralities of filter bandwidths, reference proportionality factors, feedback proportionality factors and comparator gain factors together correspond to a PLL loop gain function, and wherein said PLL loop gain function remains substantially constant for selected combinations of ones of said pluralities of filter bandwidths, reference proportionality factors, feedback proportionality factors and comparator gain factors.

12. A PLL circuit as recited in claim 10, further comprising oscillator means, coupled to said filter means and said feedback converter means, for receiving said frequency control signal and providing said oscillator output signal.

13. A PLL circuit as recited in claim 12, wherein said oscillator means comprises a voltage controlled oscillator.

14. A PLL circuit as recited in claim 12, wherein said oscillator means further receives a dynamic oscillator control signal having active and inactive states and in accordance therewith provides said oscillator output signal, and wherein said oscillator output signal is provided in accordance with one of a plurality of oscillator gain factors selected in accordance with said dynamic oscillator control signal, and further wherein said selected one of said plurality of oscillator gain factors corresponds to said one of said plurality of time intervals, and still further wherein said active state of said dynamic oscillator control signal coincides with said active states of said dynamic filter control signal, said dynamic reference control signal, said dynamic feedback control signal and said dynamic comparator control signal.

15. A PLL circuit as recited in claim 14, wherein said selected ones of said pluralities of filter bandwidths, reference proportionality factors, feedback proportionality factors, comparator gain factors and oscillator gain factors together correspond to a PLL loop gain function, and wherein said PLL loop gain function remains substantially constant for selected combinations of ones of said pluralities of filter bandwidths, reference proportionality factors, feedback proportionality factors, comparator gain factors and oscillator gain factors.

16. A PLL circuit as recited in claim 1, further comprising oscillator means, coupled to said filter means and said feedback converter means, for receiving said frequency control signal and providing said oscillator output signal.

17. A PLL circuit as recited in claim 16, wherein said oscillator means comprises a voltage controlled oscillator.

18. A PLL circuit as recited in claim 16, wherein said oscillator means further receives a dynamic oscillator control signal having active and inactive states and in accordance therewith provides said oscillator output signal, and wherein said oscillator output signal is provided in accordance with one of a plurality of oscillator gain factors selected in accordance with said dynamic oscillator control signal, and further wherein said selected one of said plurality of oscillator gain factors corresponds to said one of said plurality of time intervals, and still further wherein said active state of said dynamic oscillator control signal coincides with said active states of said dynamic filter control signal, said dynamic reference control signal and said dynamic feedback control signal.

19. A PLL circuit as recited in claim 18, wherein said selected ones of said pluralities of filter bandwidths, reference proportionality factors, feedback proportionality factors and oscillator gain factors together correspond to a PLL loop gain function, and wherein said PLL loop gain function remains substantially constant for selected combinations of ones of said pluralities of filter bandwidths, reference proportionality factors, feedback proportionality factors and oscillator gain factors.

20. A PLL circuit as recited in claim 1, wherein said plurality of time intervals includes a minimum time interval which is smaller than each other one of said plurality of time intervals.

21. A PLL circuit as recited in claim 1, further comprising controller means, coupled to said filter means, said reference converter means and said feedback converter means, for receiving a frequency select signal and in accordance therewith providing said filter control signal, said reference control signal and said feedback control signal.

22. A phase lock loop (PLL) circuit for controlling an oscillator to provide an output signal which is phase-locked to a reference signal with high frequency stepping resolution and low phase locking time, said PLL circuit comprising:

a comparator which receives first and second comparator signals at first and second comparator signal frequencies and phases, respectively, and which compares said first and second comparator signals and in accordance therewith provides a third comparator signal representing a phase difference between said first and second comparator signal phases;

a filter, coupled to said comparator, which receives said third comparator signal, and which receives a dynamic filter control signal having active and inactive states and in accordance therewith filters said third comparator signal to provide a frequency control signal for controlling an oscillator to select a frequency of an output signal from said oscillator, wherein said third comparator signal is filtered in accordance with one of a plurality of filter bandwidths selected in accordance with said dynamic filter control signal;

a reference converter, coupled to said comparator, which receives a reference source signal at a reference source signal frequency, and which receives a dynamic reference control signal having active and inactive states and in accordance therewith provides said first comparator signal, wherein said first comparator signal frequency is proportional to said reference source signal frequency in accordance with one of a plurality of reference proportionality factors selected in accordance with said dynamic reference control signal; and a feedback converter, coupled to said comparator, which receives said oscillator output signal at said oscillator output signal frequency, and which receives a dynamic feedback control signal having active and inactive states and in accordance therewith provides said second comparator signal, wherein said second comparator signal frequency is proportional to said oscillator output signal frequency in accordance with one of a plurality of feedback proportionality factors selected in accordance with said dynamic feedback control signal;

wherein said selected ones of said pluralities of filter bandwidths, reference proportionality factors and feedback proportionality factors together correspond to one of a plurality of time intervals, and wherein said active states of said dynamic filter control signal, said dynamic reference control signal and said dynamic feedback control signal all coincide with one another.

23. A PLL circuit as recited in claim 22, wherein said comparator comprises a phase detector.

24. A PLL circuit as recited in claim 22, wherein said filter comprises a low pass filter.

25. A PLL circuit as recited in claim 22, wherein said reference converter comprises a frequency divider and said plurality of reference proportionality factors comprises a plurality of reference divisors.

26. A PLL circuit as recited in claim 25, wherein said frequency divider comprises a programmable counter.

27. A PLL circuit as recited in claim 22, wherein said reference converter comprises a frequency multiplier and said plurality of reference proportionality factors comprises a plurality of reference multipliers.

28. A PLL circuit as recited in claim 22, wherein said feedback converter comprises a frequency divider and said plurality of feedback proportionality factors comprises a plurality of feedback divisors.

29. A PLL circuit as recited in claim 28, wherein said frequency divider comprises a programmable counter.

30. A PLL circuit as recited in claim 22, wherein said selected ones of said pluralities of filter bandwidths, reference proportionality factors and feedback proportionality factors together correspond to a PLL loop gain function, and wherein said PLL loop gain function remains substantially constant for selected combinations of ones of said pluralities of filter bandwidths, reference proportionality factors and feedback proportionality factors.

31. A PLL circuit as recited in claim 22, wherein said comparator further receives a dynamic comparator control signal having active and inactive states and in accordance therewith compares said first and second comparator signals to provide said third comparator signal, and wherein said third comparator signal is provided in accordance with one of a plurality of comparator gain factors selected in accordance with said dynamic comparator control signal, and further wherein said selected one of said plurality of comparator gain factors corresponds to said one of said plurality of time intervals, and still further wherein said active state of said dynamic comparator control signal coincides with said active states of said dynamic filter control signal, said dynamic reference control signal and said dynamic feedback control signal.

32. A PLL circuit as recited in claim 31, wherein said selected ones of said pluralities of filter bandwidths, reference proportionality factors, feedback proportionality factors and comparator gain factors together correspond to a PLL loop gain function, and wherein said PLL loop gain function remains substantially constant for selected combinations of ones of said pluralities of filter bandwidths, reference proportionality factors, feedback proportionality factors and comparator gain factors.

33. A PLL circuit as recited in claim 31, further comprising an oscillator, coupled to said filter and said feedback converter, which receives said frequency control signal and provides said oscillator output signal.

34. A PLL circuit as recited in claim 33, wherein said oscillator comprises a voltage controlled oscillator.

35. A PLL circuit as recited in claim 33, wherein said oscillator further receives a dynamic oscillator control signal having active and inactive states and in accordance therewith provides said oscillator output signal, and wherein said oscillator output signal is provided in accordance with one of a plurality of oscillator gain factors selected in accordance with said dynamic oscillator control signal, and further wherein said selected one of said plurality of oscillator gain factors corresponds to said one of said plurality of time intervals, and still further wherein said active state of said dynamic oscillator control signal coincides with said active states of said dynamic filter control signal, said dynamic reference control signal, said dynamic feedback control signal and said dynamic comparator control signal.

36. A PLL circuit as recited in claim 35, wherein said selected ones of said pluralities of filter bandwidths, reference proportionality factors, feedback proportionality factors, comparator gain factors and oscillator gain factors together correspond to a PLL loop gain function, and wherein said PLL loop gain function remains substantially constant for selected combinations of ones of said pluralities of filter bandwidths, reference proportionality factors, feedback proportionality factors, comparator gain factors and oscillator gain factors.

37. A PLL circuit as recited in claim 22, further comprising an oscillator, coupled to said filter and said feedback converter, which receives said frequency control signal and provides said oscillator output signal.

38. A PLL circuit as recited in claim 37, wherein said oscillator comprises a voltage controlled oscillator.

39. A PLL circuit as recited in claim 37, wherein said oscillator further receives a dynamic oscillator control signal having active and inactive states and in accordance therewith provides said oscillator output signal, and wherein said oscillator output signal is provided in accordance with one of a plurality of oscillator gain factors selected in accordance with said dynamic oscillator control signal, and further wherein said selected one of said plurality of oscillator gain factors corresponds to said one of said plurality of time intervals, and still further wherein said active state of said dynamic oscillator control signal coincides with said active states of said dynamic filter control signal, said dynamic reference control signal and said dynamic feedback control signal.

40. A PLL circuit as recited in claim 39, wherein said selected ones of said pluralities of filter bandwidths, reference proportionality factors, feedback proportionality factors and oscillator gain factors together correspond to a PLL loop gain function, and wherein said PLL loop gain function remains substantially constant for selected combinations of ones of said pluralities of filter bandwidths, reference proportionality factors, feedback proportionality factors and oscillator gain factors.

41. A PLL circuit as recited in claim 22, wherein said plurality of time intervals includes a minimum time interval which is smaller than each other one of said plurality of time intervals.

42. A PLL circuit as recited in claim 22, further comprising a controller, coupled to said filter, said reference converter and said feedback converter, which receives a frequency select signal and in accordance therewith provides said filter control signal, said reference control signal and said feedback control signal.

43. A phase lock loop (PLL) method for controlling an oscillator to provide an output signal which is phase-locked to a reference signal with high frequency stepping resolution and low phase locking time, said PLL method comprising the steps of:
receiving a reference source signal at a reference source signal frequency;
receiving a dynamic reference control signal having active and inactive states and in accordance therewith selecting one of a plurality of reference proportionality factors;

providing a first comparator signal at a first comparator signal frequency and phase, wherein said first comparator signal frequency is proportional to said reference source signal frequency in accordance with said selected one of said plurality of reference proportionality factors;

receiving an oscillator output signal at an oscillator output signal frequency;

receiving a dynamic feedback control signal having active and inactive state and in accordance therewith selecting one of a plurality of feedback proportionality factors;

providing a second comparator signal at a second comparator signal frequency and phase, wherein said second comparator signal frequency is proportional to said oscillator output signal frequency in accordance with said selected one of said plurality of feedback proportionality factors;

comparing said first and second comparator signals;

providing a third comparator signal which represents a phase difference between said first and second comparator signal phases;

receiving a dynamic filter control signal having active and inactive states and in accordance therewith selecting one of a plurality of filter bandwidths;

filtering said third comparator signal in accordance with said selected one of said plurality of filter bandwidths to provide a frequency control signal for controlling an oscillator to select said frequency of said output signal from said oscillator;

wherein said selected ones of said pluralities of filter bandwidths, reference proportionality factors and feedback proportionality factors together correspond to one of a plurality of time intervals, and wherein said active states of said dynamic filter control signal, said dynamic reference control signal and said dynamic feedback control signal all coincide with one another.

44. A PLL method as recited in claim 43, wherein said step of providing a first comparator signal at a first comparator signal frequency and phase comprises dividing said reference source signal frequency with one of a plurality of reference divisors.

45. A PLL method as recited in claim 44, wherein said step of dividing said reference source signal frequency with one of a plurality of reference divisors comprises dividing said reference source signal frequency with a programmable counter.

46. A PLL method as recited in claim 43, wherein said step of providing a first comparator signal at a first comparator signal frequency and phase comprises multiplying said reference source signal frequency with one of a plurality of reference multipliers.

47. A PLL method as recited in claim 43, wherein said step of providing a second comparator signal at a second comparator signal frequency and phase comprises dividing said oscillator output signal frequency with one of a plurality of feedback divisors.

48. A PLL method as recited in claim 47, wherein said step of dividing said oscillator output signal frequency with one of a plurality of feedback divisors comprises dividing said oscillator output signal frequency with a programmable counter.

49. A PLL method as recited in claim 43, wherein said step of comparing said first and second comparator signals and in accordance therewith providing a third comparator signal which represents a phase difference between said first and second comparator signal phases comprises comparing said first and second comparator signals with a phase detector.

50. A PLL method as recited in claim 43, wherein said step of filtering said third comparator signal in accordance with said selected one of said plurality of filter bandwidths to provide a frequency control signal for controlling an oscillator to select said frequency of said output signal from said oscillator comprises filtering said third comparator signal with a low pass filter.

51. A PLL method as recited in claim 43, wherein said selected ones of said pluralities of filter bandwidths, reference proportionality factors and feedback proportionality factors together correspond to a PLL loop gain function, and wherein said PLL loop gain function remains substantially constant for selected combinations of ones of said pluralities of filter bandwidths, reference proportionality factors and feedback proportionality factors.

52. A PLL method as recited in claim 43, further comprising the step of receiving a dynamic comparator control signal having active and inactive states and in accordance therewith selecting one of a plurality of comparator gain factors, wherein said step of providing a third comparator signal which represents a phase difference between said first and second comparator signal phases comprises providing said third comparator signal in accordance with said selected one of said plurality of comparator gain factors, and wherein said selected one of said plurality of comparator gain factors corresponds to said one of said plurality of time intervals, and further wherein said active state of said dynamic comparator control signal coincides with said active states of said dynamic filter control signal, said dynamic reference control signal and said dynamic feedback control signal.

53. A PLL method as recited in claim 52, wherein said selected ones of said pluralities of filter bandwidths, reference proportionality factors, feedback proportionality factors and comparator gain factors together correspond to a PLL loop gain function, and wherein said PLL loop gain function remains substantially constant for selected combinations of ones of said pluralities of filter bandwidths, reference proportionality factors, feedback proportionality factors and comparator gain factors.

54. A PLL method as recited in claim 52, further comprising the steps of receiving said frequency control signal and in accordance therewith providing said oscillator output signal.

55. A PLL method as recited in claim 54, wherein said step of providing said oscillator output signal comprises generating said oscillator output signal with a voltage controlled oscillator.

56. A PLL method as recited in claim 54, further comprising the step of receiving a dynamic oscillator control signal having active and inactive states and in accordance therewith selecting one of a plurality of oscillator gain factors, wherein said step of providing said oscillator output signal comprises providing said oscillator output signal in accordance with said selected one of said plurality of oscillator gain factors, and wherein said selected one of said plurality of oscillator gain factors corresponds to said one of said plurality of time intervals, and further wherein said active state of said dynamic oscillator control signal coincides with said active states of said dynamic filter control signal, said dynamic reference control signal, said dynamic feedback control signal and said dynamic comparator control signal.

57. A PLL method as recited in claim 56, wherein said selected ones of said pluralities of filter bandwidths, reference proportionality factors, feedback proportionality factors, comparator gain factors and oscillator gain factors together correspond to a PLL loop gain function, and wherein said PLL loop gain function remains substantially constant for selected combinations of ones of said pluralities of filter bandwidths, reference proportionality factors, feedback proportionality factors, comparator gain factors and oscillator gain factors.

58. A PLL method as recited in claim 43, further comprising the steps of receiving said frequency control signal and in accordance therewith providing said oscillator output signal.

59. A PLL method as recited in claim 58, wherein said step of providing said oscillator output signal comprises providing said oscillator output signal with a voltage controlled oscillator.

60. A PLL method as recited in claim 58, further comprising the step of receiving a dynamic oscillator control signal having active and inactive states and in accordance therewith selecting one of a plurality of oscillator gain factors, wherein said step of providing said oscillator output signal comprises providing said oscillator output signal in accordance with said selected one of said plurality of oscillator gain factors, and wherein said selected one of said plurality of oscillator gain factors corresponds to said one of said plurality of time intervals, and further wherein said active state of said dynamic oscillator control signal coincides with said active states of said dynamic filter control signal, said dynamic reference control signal, said dynamic feedback control signal.

61. A PLL method as recited in claim 60, wherein said selected ones of said pluralities of filter bandwidths, reference proportionality factors, feedback proportionality factors and oscillator gain factors together correspond to a PLL loop gain function, and wherein said PLL loop gain function remains substantially constant for selected combinations of ones of said pluralities of filter bandwidths, reference proportionality factors, feedback proportionality factors and oscillator gain factors.

62. A PLL method as recited in claim 43, wherein said plurality of time intervals includes a minimum time interval which is smaller than each other one of said plurality of time intervals.

63. A PLL method as recited in claim 43, further comprising the steps of receiving a frequency select signal and in accordance therewith providing said filter control signal, said reference control signal and said feedback control signal.

* * * * *

UNITED STATES PATENT AND TRADEMARK OFFICE
CERTIFICATE OF CORRECTION

PATENT NO.  : 5,420,545
DATED       : May 30, 1995
INVENTOR(S) : Craig M. Davis; David A. Byrd It is certified that error appears in the above-indentified patent and that said Letters Patent is hereby corrected as shown below:

In Col. 13, line 10, please add the letter --s-- to the word "state".

Signed and Sealed this

Twenty-second Day of August, 1995

*Attest:*

BRUCE LEHMAN

*Attesting Officer*  *Commissioner of Patents and Trademarks*